United States Patent
Sato et al.

(10) Patent No.: US 9,905,504 B1
(45) Date of Patent: Feb. 27, 2018

(54) CARRIER BASE MATERIAL-ADDED WIRING SUBSTRATE

(71) Applicant: SHINKO ELECTRIC INDUSTRIES CO., LTD., Nagano-shi, Nagano-ken (JP)

(72) Inventors: Junji Sato, Nagano (JP); Hitoshi Kondo, Nagano (JP); Katsuya Fukase, Nagano (JP)

(73) Assignee: Shinko Electric Industries Co., Ltd. (JP)

( * ) Notice: Subject to any disclaimer, the term of this patent is extended or adjusted under 35 U.S.C. 154(b) by 0 days.

(21) Appl. No.: 15/714,391

(22) Filed: Sep. 25, 2017

(30) Foreign Application Priority Data

Sep. 30, 2016 (JP) ................. 2016-192806

(51) Int. Cl.
| | |
|---|---|
| H05K 1/14 | (2006.01) |
| H01L 23/498 | (2006.01) |
| H01L 23/13 | (2006.01) |
| H01L 21/683 | (2006.01) |
| H01L 21/48 | (2006.01) |
| H01L 23/00 | (2006.01) |
| H01L 23/31 | (2006.01) |
| H01L 21/66 | (2006.01) |

(52) U.S. Cl.
CPC .... *H01L 23/49822* (2013.01); *H01L 21/4857* (2013.01); *H01L 21/6835* (2013.01); *H01L 23/13* (2013.01); *H01L 23/49838* (2013.01); *H01L 21/486* (2013.01); *H01L 22/14* (2013.01); *H01L 23/3114* (2013.01); *H01L 23/3128* (2013.01); *H01L 24/16* (2013.01); *H01L 24/81* (2013.01); *H01L 2221/68345* (2013.01); *H01L 2221/68359* (2013.01); *H01L 2221/68381* (2013.01); *H01L 2224/16227* (2013.01); *H01L 2924/3511* (2013.01)

(58) Field of Classification Search
CPC ......... H05K 1/144; H05K 1/036; H05K 1/118
See application file for complete search history.

(56) References Cited

FOREIGN PATENT DOCUMENTS

| | | | |
|---|---|---|---|
| JP | 2003-309215 | A | 10/2003 |
| JP | 2003-347459 | A | 12/2003 |
| JP | 2016-048768 | A | 4/2016 |

*Primary Examiner* — Jeremy C Norris
(74) *Attorney, Agent, or Firm* — Tarolli, Sundheim, Covell & Tummino LLP

(57) ABSTRACT

A carrier base material-added wiring substrate includes a wiring substrate and first to third carrier base materials. The first carrier base material is adhered by a first adhesive layer to a lower surface of the wiring substrate and includes an opening that exposes a product area of the wiring substrate. The second carrier base material is arranged in the opening of the first carrier base material and contacts the lower surface of the wiring substrate. The third carrier base material is adhered by a second adhesive layer to the first carrier base material and the second carrier base material. The third carrier base material covers the opening of the first carrier base material. The second adhesive layer is formed entirely on an upper surface of the third carrier base material.

7 Claims, 12 Drawing Sheets

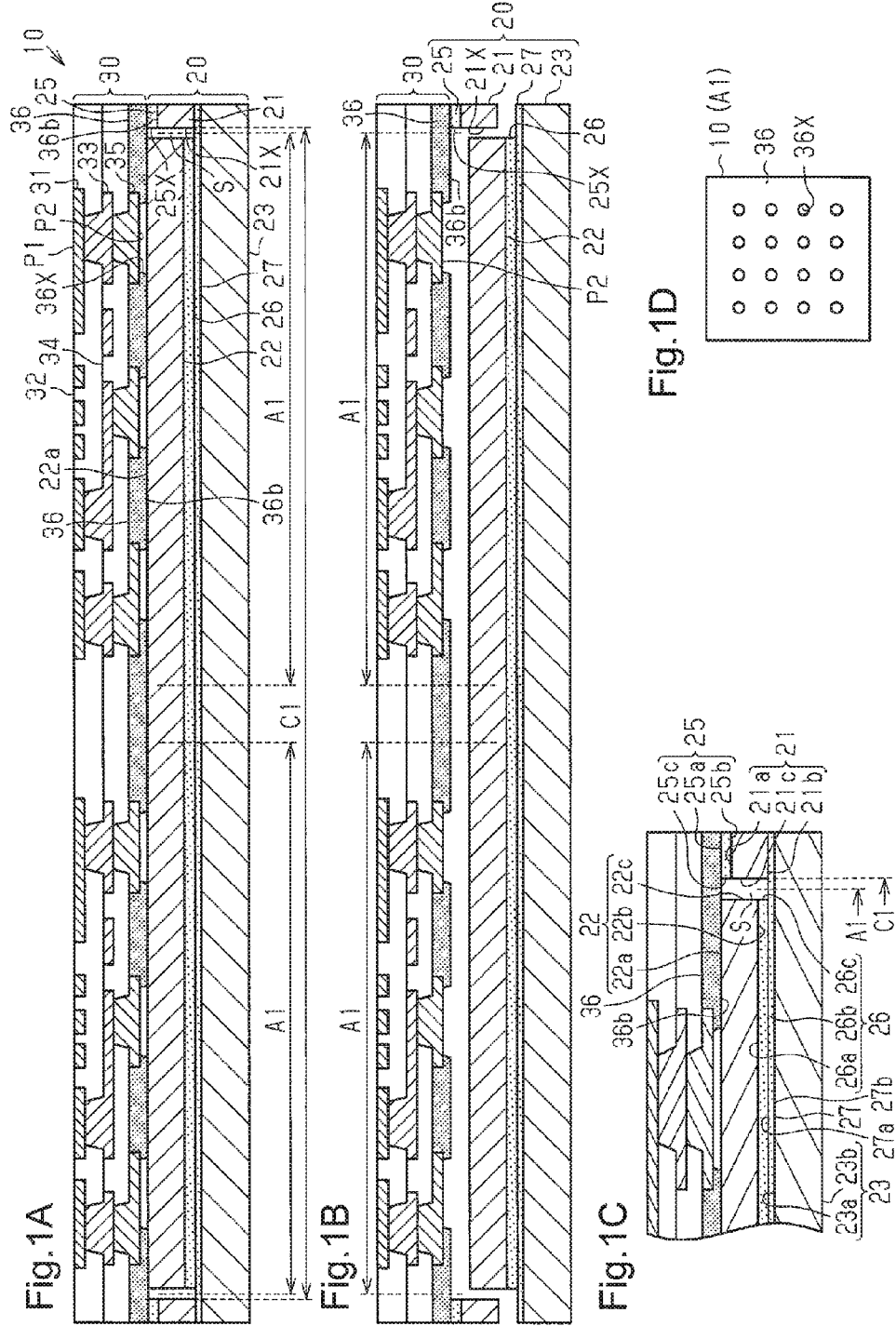

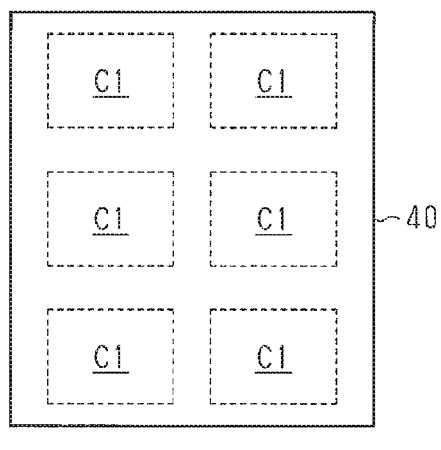
Fig.2A
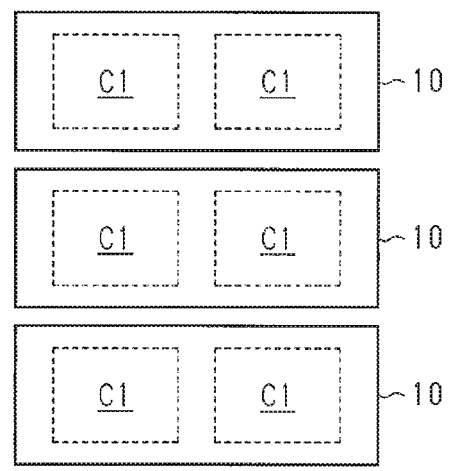
Fig.2B
Fig.2C
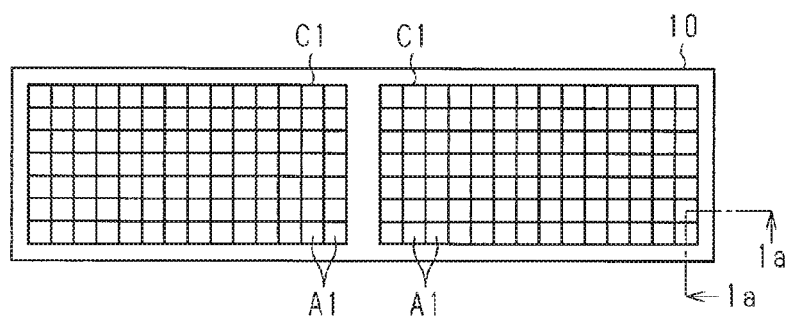

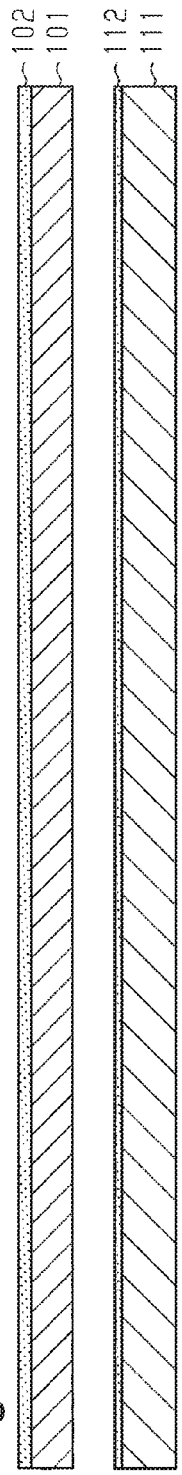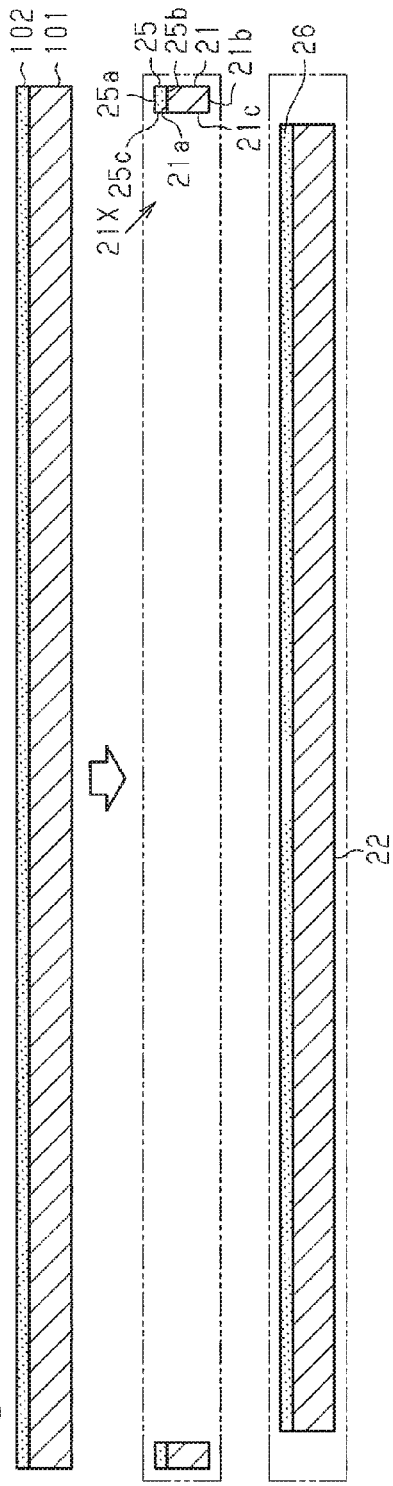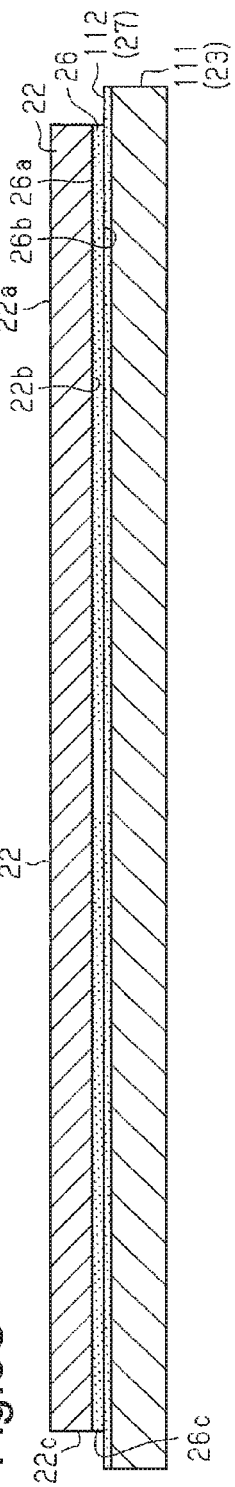

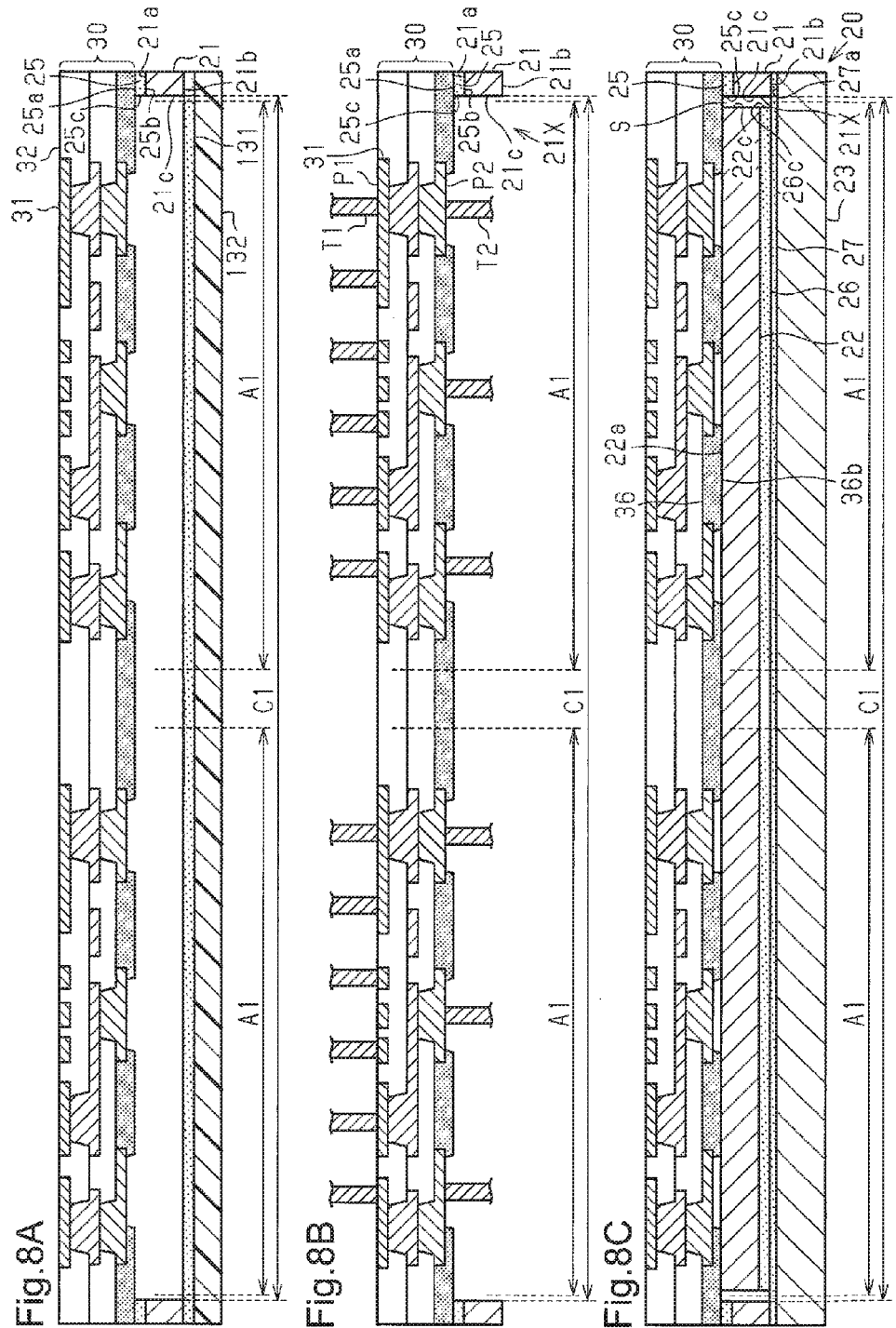

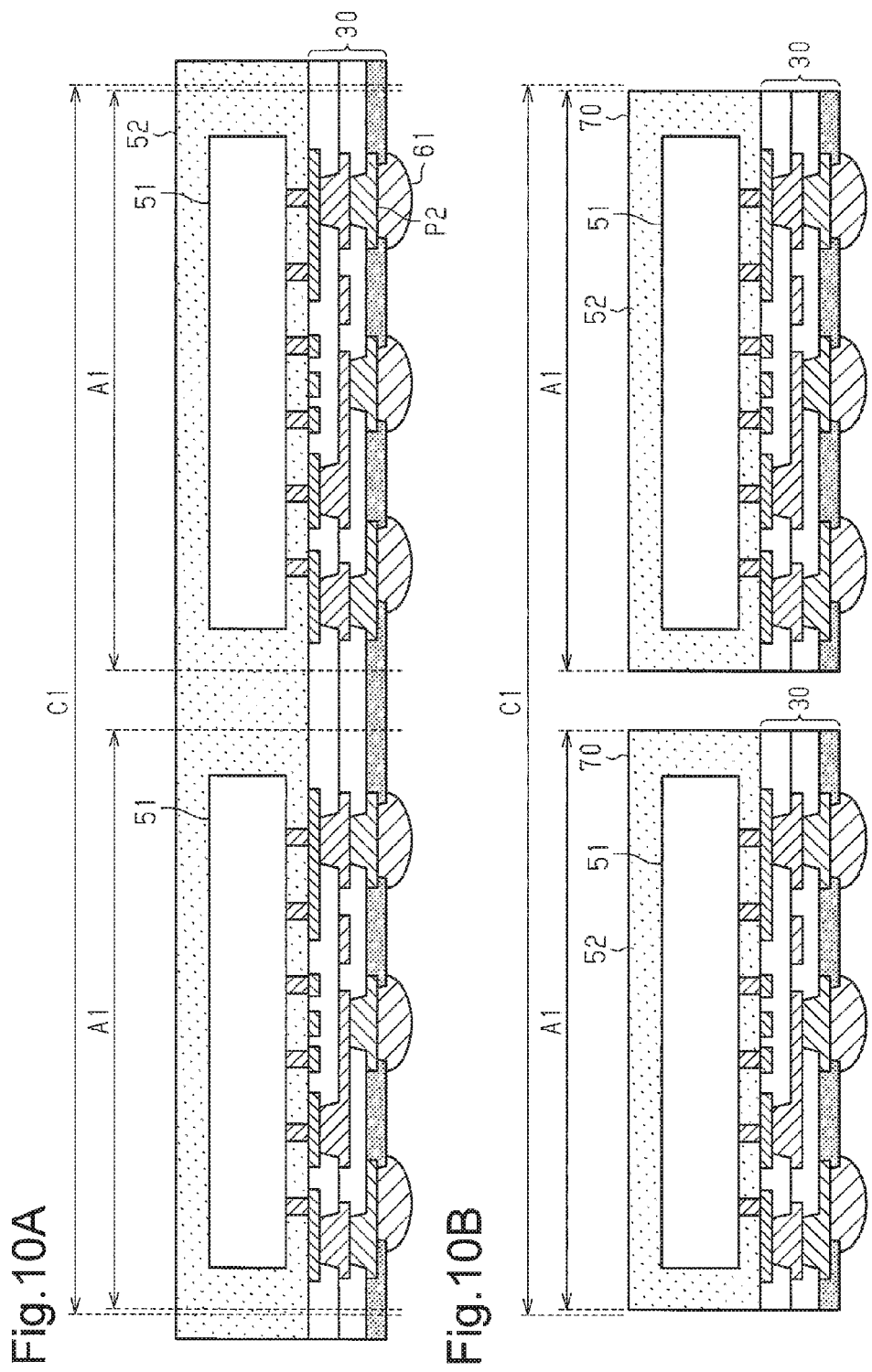

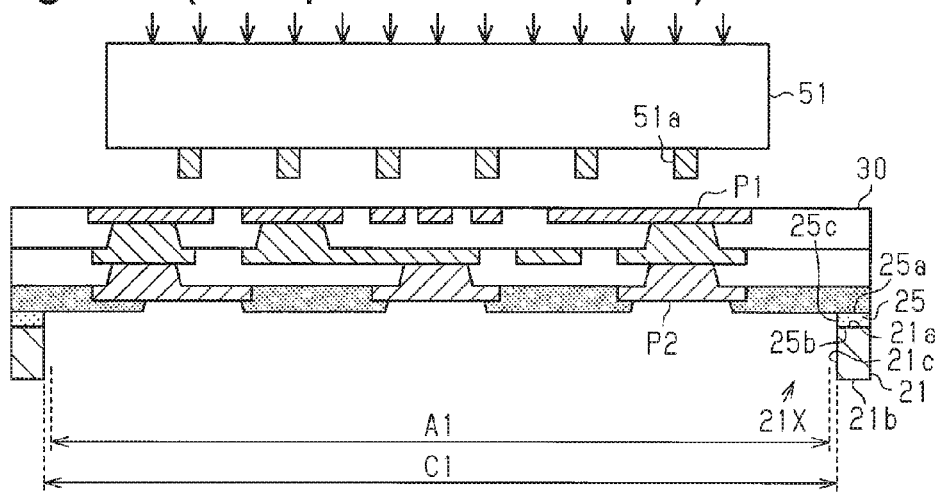
Fig.12A (Comparative Example)
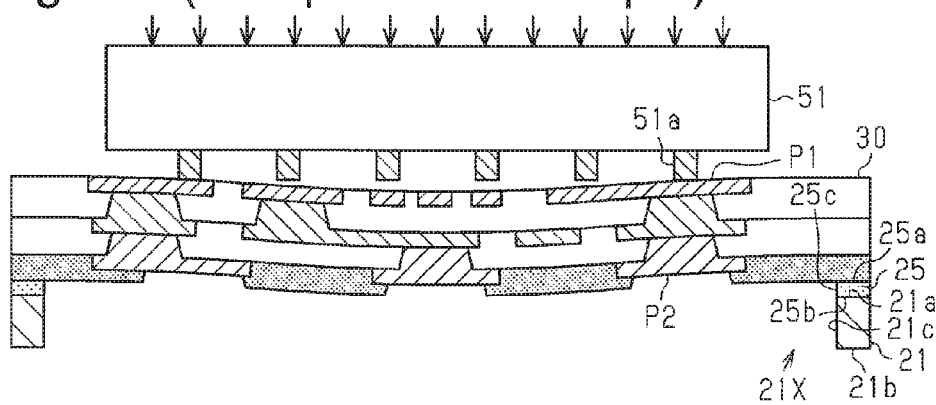
Fig.12B (Comparative Example)
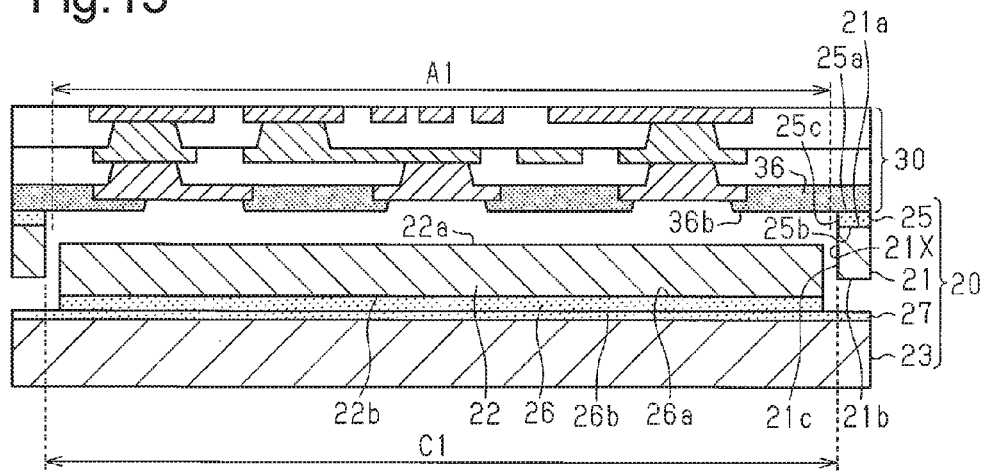
Fig.13

CARRIER BASE MATERIAL-ADDED WIRING SUBSTRATE

CROSS-REFERENCE TO RELATED APPLICATIONS

This application is based upon and claims the benefit of priority from prior Japanese Patent Application No. 2016-192806, filed on Sep. 30, 2016, the entire contents of which are incorporated herein by reference.

FIELD

This disclosure relates to a carrier base material-added wiring substrate and a method for manufacturing a carrier base material-added wiring substrate.

BACKGROUND

The density of the semiconductor elements mounted on a wiring substrate has increased. Now, there is a demand for wiring substrates that are thinner and wiring patterns that are increased in density. A coreless wiring substrate has been proposed to satisfy such demands. A coreless substrate is less a core substrate that has high rigidity and is thicker than an interlayer insulation layer. Such a wiring substrate easily warps and is difficult to handle during manufacturing processes and assembling processes. Japanese Laid-Open Patent Publication Nos. 2003-347459, 2016-048768, and 2003-309215 describe the manufacturing of a wiring substrate in a state in which the wiring substrate is adhered to a rigid tentative substrate.

SUMMARY

In an assembling step in which semiconductor elements are mounted on a wiring substrate that is adhered to a tentative substrate, deformation of the wiring substrate may cause a connection failure, damage, or the like. Thus, there is a need to reduce such deformation of the wiring substrate in the assembling step.

One embodiment is a carrier base material-added wiring substrate including a wiring substrate, a first carrier base material, a second first carrier base material, and a third first carrier base material. The first carrier base material is adhered by a first adhesive layer to a lower surface of the wiring substrate. The first carrier base material includes an opening that exposes a product area of the wiring substrate. The second carrier base material is arranged in the opening of the first carrier base material. The second carrier base material contacts the lower surface of the wiring substrate. The third carrier base material is adhered by a second adhesive layer to the first carrier base material and the second carrier base material. The third carrier base material covers the opening of the first carrier base material. The second adhesive layer is formed entirely on an upper surface of the third carrier base material.

Another embodiment is a method for manufacturing a carrier base material-added wiring substrate. The method includes preparing a first carrier base material that is frame-shaped and includes an opening corresponding to a product area of a wiring substrate, stacking wiring layers and insulation layers on a support body to form the wiring substrate, adhering the first carrier base material to the wiring substrate, removing the support body, conducting an electrical test on the wiring substrate with a probe terminal inserted into the opening of the first carrier base material, and adhering a third carrier base material, which covers the opening of the first carrier base material, to the first carrier base material while arranging a second carrier base material in the opening of the first carrier base material.

Other embodiments and advantages thereof will become apparent from the following description, taken in conjunction with the accompanying drawings, illustrating by way of example the principles of this disclosure.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIGS. 1A and 1B are schematic cross-sectional views of a carrier base material-added wiring substrate;

FIG. 1C is an enlarged cross-sectional view illustrating, in part, the carrier base material-added wiring substrate of FIG. 1A;

FIG. 1D is a schematic plan view illustrating openings in a solder resist layer;

FIG. 2A is a schematic plan view of a work substrate;

FIG. 2B is a schematic plan view of sheet-like carrier base material-added wiring substrates;

FIG. 2C is a schematic plan view illustrating product areas and product sections of the carrier base material-added wiring substrate;

FIGS. 3A to 3C are schematic cross-sectional views illustrating manufacturing steps of a carrier base material;

FIGS. 4A, 4B, 5 to 7, 8A to 8C, 9A, 9B, 10A, and 10B are schematic cross-sectional views illustrating manufacturing steps of the carrier base material-added wiring substrate;

FIGS. 12A and 12B are schematic cross-sectional views illustrating assembling steps in which a semiconductor element is mounted on a comparative example of the carrier base material-added wiring substrate; and FIG. 13 is a cross-sectional view illustrating another carrier base material-added wiring substrate.

DESCRIPTION OF THE EMBODIMENTS

Figure 4A:
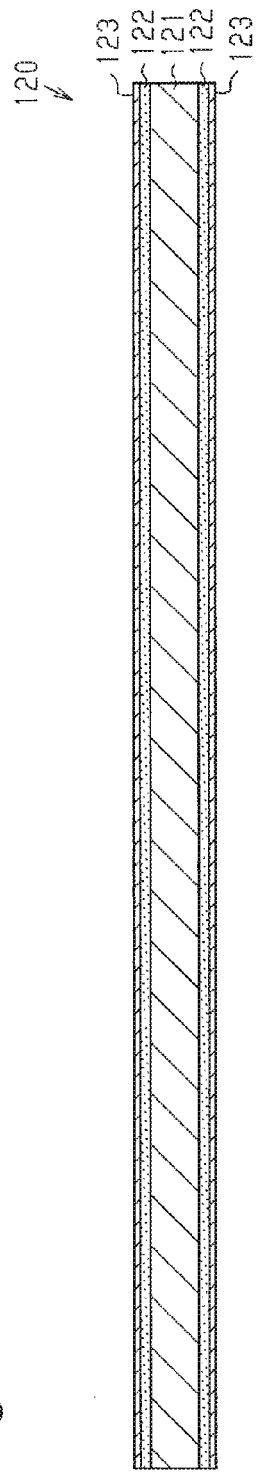

Embodiments will now be described with reference to the drawings. In the drawings, elements are illustrated for simplicity and clarity and have not necessarily been drawn to scale. To facilitate understanding, hatching lines may not be illustrated or be replaced by shadings in the cross-sectional drawings. In the present specification, a plan view refers to a bird's-eye view of a subject (for example, view in vertical direction of FIG. 1A), and a planar shape refers to the shape of a subject as viewed in a vertical direction.

Referring to FIG. 1A, a carrier base material-added wiring substrate 10 includes a carrier base material 20 and a wiring substrate 30. The carrier base material 20 is adhered to the lower surface of the wiring substrate 30 to support the wiring substrate 30.

As illustrated in FIG. 1A, the wiring substrate 30 includes a wiring layer 31, an insulation layer 32, a wiring layer 33, an insulation layer 34, a wiring layer 35, and a solder resist layer 36.

The wiring layer 31 is located in the upper surface of the insulation layer 32 and embedded in the insulation layer 32. In the present example, the upper surface of the wiring layer 31 is flush with the upper surface of the insulation layer 32. Portions in the upper surface of the wiring layer 31 are used as component connection terminals P1 that are connected to semiconductor elements 51 (refer to FIG. 9A), which are mounted on the wiring substrate 30. The insulation layer 32 covers a lower surface and side surfaces of the wiring layer 31.

The wiring layer 33 is formed on the lower surface of the insulation layer 32. The wiring layer 33 includes a wiring pattern, which is formed on the lower surface of the insulation layer 32, and via wiring, which extends through the insulation layer 32 and connects to the wiring layer 31. The insulation layer 34 is formed on the lower surface of the insulation layer 32 and covers the wiring layer 33. The wiring layer 35 is formed on the lower surface of the insulation layer 34. The wiring layer 35 includes a wiring pattern, which is formed on the lower surface of the insulation layer 34, and via wiring, which extends through the insulation layer 34 and connects to the wiring layer 33. In this manner, the wiring substrate 30 has the structure of a coreless wiring substrate obtained by stacking the wiring layer 31, the insulation layer 32, the wiring layer 33, the insulation layer 34, and the wiring layer 35 one upon another.

The solder resist layer 36 is formed on the lower surface of the insulation layer 34 and partially covers the wiring layer 35. The solder resist layer 36 includes openings 36X that expose portions of the lower surface of the wiring layer 35 as external connection terminals P2. As illustrated in FIG. 1D, the openings 36X are arranged in, for example, a matrix-like array. FIG. 1D schematically illustrates one example of the arrangement of the openings 36X but does not limit the arrangement of the openings 36X in direction and number.

The wiring layers 31, 33, and 35 may be formed from, for example, copper (Cu) or a copper alloy. The insulation layers 32 and 34 may be formed from, for example, an insulative resin such as an epoxy resin or a polyimide resin or a resin obtained by mixing a filler such as silica or alumina in an epoxy resin or a polyimide resin. The insulation layers 32 and 34 may be formed by an insulative resin that includes a reinforcement material and is obtained by impregnating a reinforcement material such as a woven cloth or a non-woven cloth of, for example, glass fibers, aramid fibers, or liquid crystal polymer (LCP) fibers with a thermosetting resin of which the main component is an epoxy resin or a polyimide resin. Alternatively, the insulation layers 32 and 34 may be formed from a thermosetting insulative resin or a photosensitive insulative resin.

The solder resist layer 36 may be, for example, a photosensitive dry film resist or a liquid photoresist. Such a resist material may be, for example, a novolak resin or an acrylic resin. For example, when using a photosensitive dry film resist, thermal compression bonding is performed to laminate the insulation layer 34 and the wiring layer 35 with a dry film. Photolithography is performed to pattern the dry film and form the solder resist layer 36 that includes the openings 36X. When using a liquid photoresist, the same processes are performed to form the solder resist layer 36.

When necessary, a surface-processed layer (not illustrated) may be formed on the surface of the wiring layer 35 exposed from the openings 36X. Examples of the surface-processed layer (not illustrated) include a gold (Au) layer, a nickel (Ni)/Au layer (metal layer in which Ni layer is bottom layer and Au layer is formed on Ni layer), and a Ni/palladium (Pd)/Au layer (metal layer in which Ni layer is bottom layer, and Ni layer, Pd layer, and Au layer are stacked one after another). Alternatively, a surface-processed layer that has undergone an oxidation resistant treatment such as an organic solderability preservative (OSP) treatment may be formed on the surface of the wiring layer 35 that is exposed from the openings 36X.

The carrier base material 20 will now be described. The carrier base material 20 includes a first carrier base material 21, a second carrier base material 22, and a third carrier base material 23.

Referring to FIGS. 1A and 1B, the first carrier base material 21 is adhered by an adhesive layer 25 to the lower surface of the wiring substrate 30, in the present example, a lower surface 36b of the solder resist layer 36. In FIG. 1B, to facilitate understanding of the first carrier base material 21, the second carrier base material 22 and the third carrier base material 23 are separated from the first carrier base material 21.

Referring to FIG. 2A, a work substrate 40 is a large substrate including a plurality of (six in FIG. 2A) product areas C1 (rectangles formed by broken lines). The work substrate 40 is cut in a sheet cutting step, which will be described later, to form the plurality of (three in FIG. 2B) carrier base material-added wiring substrates 10. In the present embodiment, each manufacturing step until the sheet cutting step is performed with the work substrate 40 in the state of FIG. 2A. As illustrated in FIG. 2C, the carrier base material-added wiring substrates 10 of the present embodiment are, for example, sheet-like substrates. The carrier base material-added wiring substrates 10 are each formed to have a rectangular shape in a plan view. The carrier base material-added wiring substrate 10 includes a plurality of (two in FIG. 2C) product areas C1. The product areas C1 are separated from one another. Each product area C1 includes a plurality of product sections A1 that are in a matrix-like array. The mounting of a semiconductor element and the formation of an encapsulation resin are performed on each product section A1. Then, the carrier base material 20 illustrated in FIG. 1A is removed. The sheet-like substrate is cut along the solid lines extending around each product section A1 to singulate a plurality of semiconductor devices (semiconductor packages) that are illustrated in FIG. 10B. FIG. 1A is a schematic cross-section taken along line 1a-1a in FIG. 2C.

Referring to FIGS. 1A and 1B, the first carrier base material 21 is frame-shaped and includes openings 21X, each corresponding to one of the product areas C1 of the wiring substrate 30. Each opening 21X exposes the product sections A1 of the corresponding product area C1. Thus, each opening 21X of the first carrier base material 21 exposes the external connection terminals P2 of the wiring substrate 30 and portions of the lower surface 36b of the solder resist layer 36. The product sections A1 of the wiring substrate 30 are the regions where semiconductor elements mounted on the wiring substrate 30 are encapsulated and then singulated into the semiconductor devices (semiconductor packages).

Referring to FIG. 1C, the first carrier base material 21 includes an upper surface 21a, a lower surface 21b, and side surfaces 21c. The upper surface 21a of the first carrier base material 21 is adhered to the adhesive layer 25. The lower surface 21b of the first carrier base material 21 is adhered to the peripheral portion of an upper surface 27a of an adhesive layer 27. The peripheral portion of the upper surface 27a of the adhesive layer 27 is the region located outward from the product areas C1 of the wiring substrate 30.

The adhesive layer 25 includes an upper surface 25a, a lower surface 25b, and side surfaces 25c. The upper surface 25a of the adhesive layer 25 is adhered to the lower surface 36b of the solder resist layer 36 at the outer side of the product areas C1 of the wiring substrate 30. The lower surface 25b of the adhesive layer 25 is in contact with the upper surface 21a of the first carrier base material 21. The adhesive layer 25 includes opening 25X, each corresponding to one of the product areas C1 of the wiring substrate 30. For the sake of brevity, the opening 21X of the first carrier base material 21 and the opening 25X of the adhesive layer 25 will together be referred to as the opening 21X of the first carrier base material 21, and the opening 25X may not be described.

The side surfaces 21c of the first carrier base material 21 are flush with the side surfaces 25c of the adhesive layer 25. Further, the side surfaces 21c and 25c set the contours of the openings 21X and 25X. In other words, the first carrier base material 21 and the adhesive layer 25 are identical in shape in a plan view.

The second carrier base material 22 is located in the opening 21X of the first carrier base material 21 (opening 21X of first carrier base material 21 and opening 25X of adhesive layer 25). The second carrier base material 22 includes an upper surface 22a, a lower surface 22b, and side surfaces 22c. The upper surface 22a of the second carrier base material 22 is in direct contact with the lower surface 36b of the solder resist layer 36 in the product areas C1 of the wiring substrate 30. The upper surface 22a of the second carrier base material 22 is in contact with the lower surface 36b of the solder resist layer 36 but not adhered to the lower surface 36b. In other words, an adhesive layer is not located between the second carrier base material 22 and the wiring substrate 30 (i.e., solder resist layer 36). The lower surface 22b of the second carrier base material 22 is adhered to an adhesive layer 26. The second carrier base material 22 has a thickness that is set to be, for example, the same as that of the first carrier base material 21. The second carrier base material 22 is adhered by the adhesive layers 26 and 27 to an upper surface 23a of the third carrier base material 23.

The adhesive layer 26 includes an upper surface 26a, a lower surface 26b, and side surfaces 26c. The upper surface 26a of the adhesive layer 26 is adhered to the lower surface 22b of the second carrier base material 22. The lower surface 26b of the adhesive layer 26 is adhered to a central portion of the upper surface 27a of the adhesive layer 27 (in each product area C1 of wiring substrate 30).

The side surfaces 22c of the second carrier base material 22 are flush with the side surfaces 26c of the adhesive layer 26. In other words, the second carrier base material 22 and the adhesive layer 26 are identical in shape in a plan view.

The side surfaces 21c of the first carrier base material 21 and the side surfaces 25c of the adhesive layer 25 are spaced apart from and face to the side surfaces 22c of the second carrier base material 22 and the side surfaces 26c of the adhesive layer 26. The side surfaces 21c and 25c are spaced apart by a gap S from the side surfaces 22c and 26c.

The third carrier base material 23 covers the opening 21X of the first carrier base material 21 (opening 21X of first carrier base material 21 and opening 25X of adhesive layer 25). The third carrier base material 23 is adhered by the adhesive layer 27 to the lower surface 21b of the first carrier base material 21. Further, the third carrier base material 23 is adhered by the adhesive layers 26 and 27 to the lower surface 22b of the second carrier base material 22. The third carrier base material 23 includes the upper surface 23a and a lower surface 23b. The upper surface 23a of the third carrier base material 23 is adhered to a lower surface 27b of the adhesive layer 27. The lower surface 23b of the third carrier base material 23 is exposed to the outside. The third carrier base material 23 has a thickness that is set to be, for example, the same as that of each of the first carrier base material 21 and the second carrier base material 22.

The adhesive layer 27 includes the upper surface 27a and the lower surface 27b. The upper surface 27a of the adhesive layer 27 includes a central portion and a peripheral portion. The central portion of the upper surface 27a is adhered to the adhesive layer 26 at the region corresponding to the product area C1 of the wiring substrate 30. The peripheral portion of the upper surface 27a is adhered to the lower surface 21b of the first carrier base material 21 at the region located outward from the product area C1 of the wiring substrate 30. The lower surface 27b of the adhesive layer 27 is adhered to the upper surface 23a of the third carrier base material 23.

The carrier base material 21 may be, for example, a core substrate, a metal foil, or a film. An example of a core substrate is a glass epoxy substrate that is a composite of a reinforcement material and a hardened product of a thermosetting resin impregnated in the reinforcement material. The reinforcement material is, for example, a glass cloth (woven glass cloth), non-woven glass cloth, woven aramid cloth, non-woven aramid cloth, woven liquid crystal polymer (LCP) cloth, or non-woven LCP cloth. The thermosetting insulative resin is, for example, an epoxy resin, a polyimide resin, or a cyanate resin. The metal foil may be formed from, for example, copper or stainless steel. The film may be formed from, for example, an epoxy resin, a phenol resin, or a polyimide resin.

The second carrier base material 22 may be formed from a material selected from the examples of the material of the first carrier base material 21. In the same manner, the third carrier base material 23 may be formed from a material selected from the examples of the material of the first carrier base material 21. The adhesive layer 25 may be formed by, for example, a material of which the adhesive force decreases when irradiated with ultraviolet rays. In the same manner, the adhesive layer 26 may be formed by, for example, a material of which the adhesive force decreases when irradiated with ultraviolet rays. The material of the adhesive layer 27 has a stronger adhesive force than the adhesive layers 25 and 26.

In the present embodiment, the second carrier base material 22 is formed from the same material as the first carrier base material 21. The second carrier base material 22 and the first carrier base material 21 have the same thickness. Further, the adhesive layer 26 and the adhesive layer 25 have the same thickness.

The manufacturing steps of the carrier base material-added wiring substrate 10 will now be described. In the description hereafter, the reference characters in the drawings are only added to components that will be described. Further, to facilitate understanding, the reference characters used in the drawings are in conformance with the reference characters used for the ultimate elements of the semiconductor device.

In the description hereafter, the manufacturing steps of the carrier base material-added wiring substrate 10 will be described with reference to drawings that are enlarged views of the cross section taken along line 1a-1a in FIG. 2C. In some cases, the work substrate 40 illustrated in FIG. 2A will be referred to in the description.

In the step of FIG. 3A, two substrates 101 and 111 are prepared. The substrates 101 and 111 each have the same size as the work substrate 40 illustrated in FIG. 2A. An adhesive layer 102 is formed on the upper surface of the substrate 101. The substrate 101 may be, for example, a core substrate, a metal foil, or a film. The adhesive layer 102 may be formed by, for example, a material of which the adhesive force decreases when irradiated with ultraviolet rays.

An adhesive layer 112 is formed on the upper surface of the substrate 111. The substrate 111 may be, for example, a core substrate, a metal foil, or a film. The adhesive layer 112 is formed from a material having a stronger adhesive force than the adhesive layer 102.

Figure 11A:
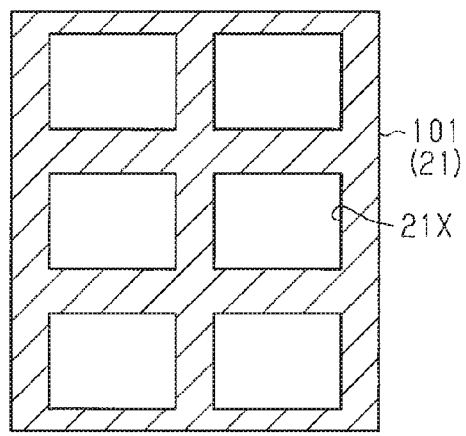
FIGS. 11A to 11D are schematic plan views illustrating manufacturing steps of the carrier base material.
Figure 11B:
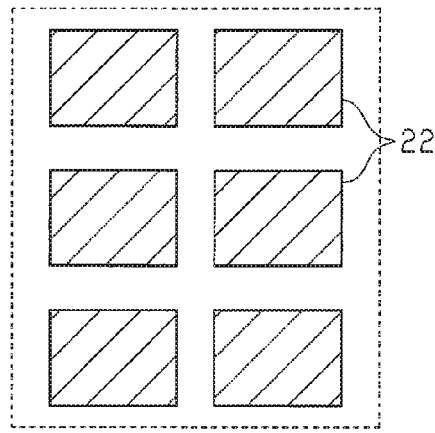

In the step of FIG. 3B, the substrate 101 is cut to form the first carrier base material 21 (used at outer side of product areas C1 of wiring substrate 30), which is illustrated in FIGS. 3B and 11A, and the second carrier base material 22 (used in product areas C1 of wiring substrate 30), which is illustrated in FIGS. 3B and 11B. FIGS. 11A to 11D are schematic plan views of the first to third carrier base materials 21 to 23 formed and used in the steps of FIGS. 3A to 3C.

The substrate 101 may be cut by performing laser drilling with a $CO_2$ laser or a YAG laser. The laser drilling cuts the substrate 101 along the periphery of the product areas C1 to obtain the first carrier base material 21, which includes the opening 21X, and the second carrier base material 22. Further, the adhesive layer 102 is cut together with the substrate 101 to obtain the adhesive layer 25, which is formed on the upper surface of the first carrier base material 21, and the adhesive layer 26, which is formed on the upper surface of the second carrier base material 22. The first carrier base material 21 includes the upper surface 21a, the lower surface 21b, and the side surfaces 21c. The upper surface 21a of the first carrier base material 21 is adhered to the adhesive layer 25. The first carrier base material 21 includes the opening 21X, which opens at the region corresponding to the product area C1 of the wiring substrate 30.

The lower surface 25b of the adhesive layer 25 is adhered to the upper surface 21a of the first carrier base material 21. The adhesive layer 25 includes the opening 25X, which opens at the region corresponding to the product area C1 of the wiring substrate 30.

The side surfaces 21c of the first carrier base material 21 are flush with the side surfaces 25c of the adhesive layer 25. The side surfaces 21c and 25c set the contours of the openings 21X and 25X. In other words, the first carrier base material 21 and the adhesive layer 25 are identical in shape in a plan view. The second carrier base material 22 and the adhesive layer 26 illustrated in FIG. 3B are reversed upside down in the step of FIG. 3C.

Referring to FIG. 1A, the second carrier base material 22 is arranged in the opening 21X of the first carrier base material 21. Thus, as illustrated in FIG. 3B, the substrate 101 is cut in correspondence with the opening 21X to be separated into the first carrier base material 21 and the second carrier base material 22 so that the material (substrate 101 and adhesive layer 102) can be used without any waste.

Figure 11C:
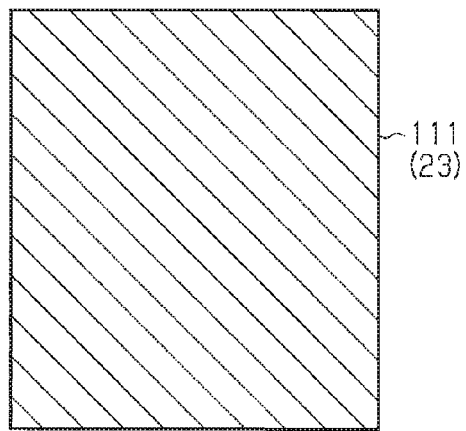
Figure 11D:
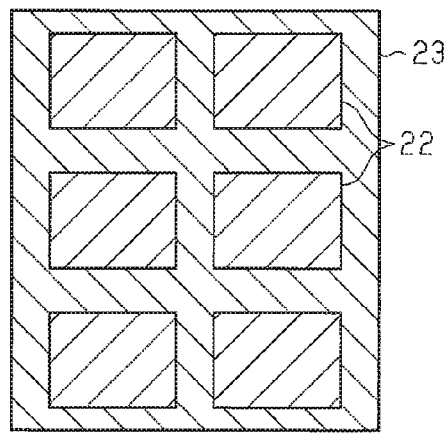

In the step of FIGS. 3C and 11D, the second carrier base material 22 is adhered to the substrate 111 illustrated in FIGS. 3A and 11C. In the present example, the adhesive layer 26 on the surface (lower surface in FIG. 3C) of the second carrier base material 22 is directed toward the adhesive layer 112 on the substrate 111. Then, the second carrier base material 22 is adhered by the adhesive layers 26 and 112 to the substrate 111. The substrate 111 corresponds to the third carrier base material 23, and the adhesive layer 112 corresponds to the adhesive layer 27. The upper surface 22a of the second carrier base material 22 directly contacts the lower surface 36b of the solder resist layer 36 in the product areas C1 of the wiring substrate 30. The lower surface 22b of the second carrier base material 22 is adhered to the adhesive layer 26. The second carrier base material 22 is adhered by the adhesive layers 26 and 27 to the upper surface 23a of the third carrier base material 23.

The upper surface 26a of the adhesive layer 26 is adhered to the lower surface 22b of the second carrier base material 22. The lower surface 26b of the adhesive layer 26 is adhered to the central portion of the upper surface 27a of the adhesive layer 27 at the region corresponding to the product area C1 of the wiring substrate 30.

The side surfaces 22c of the second carrier base material 22 are flush with the side surfaces 26c of the adhesive layer 26. In other words, the second carrier base material 22 and the adhesive layer 26 are identical in shape in a plan view.

The third carrier base material 23 is adhered by the adhesive layers 26 and 27 to the lower surface 22b of the second carrier base material 22. The upper surface 23a of the third carrier base material 23 is adhered to the lower surface 27b of the adhesive layer 27. The lower surface 23b of the third carrier base material 23 is exposed to the outside.

The upper surface 27a of the adhesive layer 27 includes the central portion, which is adhered to the adhesive layer 26 at the region corresponding to the product area C1 of the wiring substrate 30, and the peripheral portion, which is exposed to the outside at the region located outward from the product area C1 of the wiring substrate 30. The peripheral portion of the upper surface 27a is adhered to the lower surface 21b of the first carrier base material 21 in a subsequent step. The lower surface 27b of the adhesive layer 27 is adhered to the upper surface 23a of the third carrier base material 23.

The manufacturing steps of the wiring substrate 30 will now be described.

In the step of FIG. 4A, a support body 120 is formed. The support body 120 includes a support substrate 121, adhesive layers 122, and metal layers 123. The adhesive layers 122 and the metal layers 123 are formed on the opposite surfaces of the support substrate 121.

The support substrate 121 may be a member formed by, for example, impregnating a glass cloth (woven cloth), non-woven glass cloth, or aramid fibers with an epoxy resin or the like. Each adhesive layer 122 may be, for example, a metal foil such as a copper foil, an aluminum foil, a nickel foil or a zinc foil; a ceramic plate; or a resin sheet of which the main component is a resin such as acryl or polyimide. Each metal layer 123 may be, for example, a copper foil or the like.

Figure 4B:
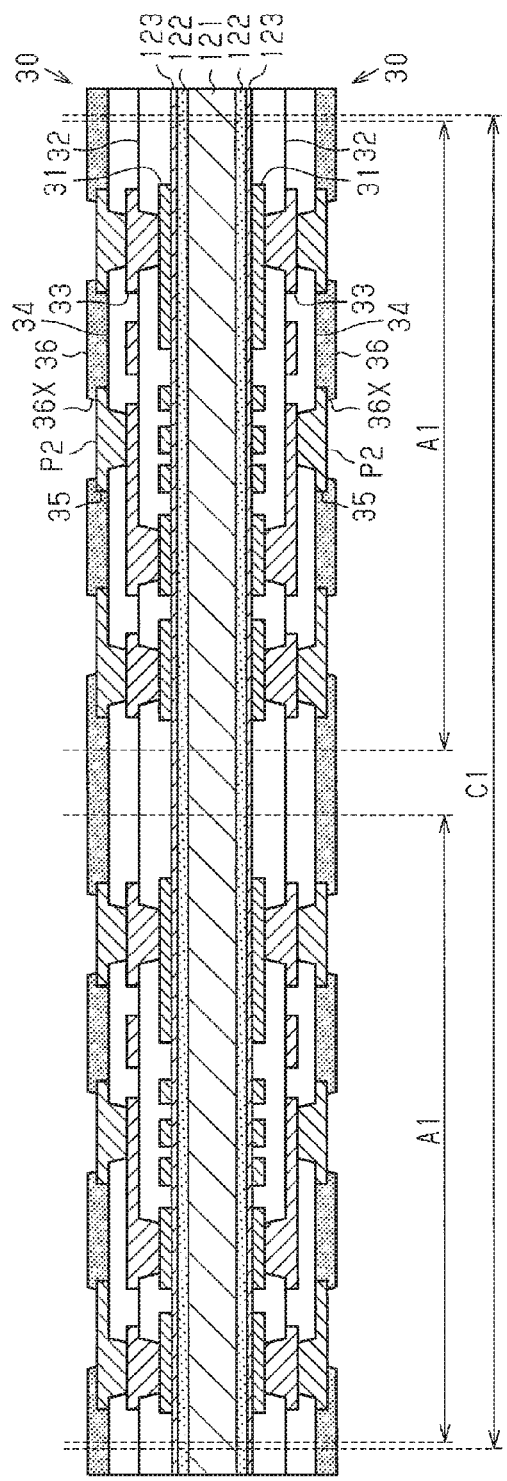

In the step of FIG. 4B, the wiring substrate 30 is formed on the metal layer 123 on each surface of the support body 120. The wiring substrate 30 includes the wiring layer 31, the insulation layer 32, the wiring layer 33, the insulation layer 34, the wiring layer 35, and the solder resist layer 36. The wiring layer 31, the insulation layer 32, the wiring layer 33, the insulation layer 34, the wiring layer 35, and the solder resist layer 36 are stacked one after another on each metal layer 123 to form the wiring substrate 30.

The wiring layer 31 is first formed on each metal layer 123. The wiring layer 31 is formed through any of a variety of wire formation processes such as a semi-additive process. For example, a resist layer including openings at certain locations is formed on the surface of the metal layer 123. The openings expose the metal layer 123 at portions corresponding to the wiring layer 31. The resist layer may be a photosensitive dry film resist or a liquid photoresist. Such photoresists may be, for example, a novolak resin or an acrylic resin. Electrolytic plating (electrolytic copper plating) is performed using the resist layer as a mask and the metal layer 123 as a plating power supplying layer to form the wiring layer 31 on the metal layer 123. Then, the resist layer is removed with, for example, an alkali delamination liquid.

The wiring layer 31 on the upper surface of the metal layer 123 is covered and laminated by an insulative resin film of a thermosetting epoxy resin or the like to form the insulation layer 32. A liquid or paste of an insulative resin such as a thermosetting epoxy resin may be applied and hardened to form the insulation layer 32. Via holes are then formed extending through the insulation layer 32 to expose portions of the wiring layer 31. The via holes may be formed by, for example, performing laser drilling with a $CO_2$ laser or the like. When necessary, a desmearing process may also be performed.

The wiring layer 33 is then formed. The wiring layer 33 may be formed through, for example, a semi-additive process. For example, a seed layer is first formed on the upper surface of the insulation layer 32 by performing, for example, electroless plating. Then, a resist layer including openings at given locations is formed on the seed layer. As described above, the resist layer may be a photosensitive dry film resist or a liquid photoresist (e.g., novolak resin or acrylic resin). Electrolytic plating (electrolytic copper plating) is performed using the resist layer as a mask and the seed layer as a plating power supplying layer to form an electrolytic plating layer. After removing the resist layer with, for example, an alkali delamination liquid, etching is performed using the electrolytic plating layer as an etching mask to remove unnecessary portions of the seed layer. This forms the wiring layer 33.

Then, steps that are the same as the step of forming the insulation layer 32 and the step of forming the wiring layer 33 are repeated to form the insulation layer 34 and the wiring layer 35. In this manner, a given number of wiring layers and insulation layers are alternately stacked upon one another to form a wiring structure.

Then, the solder resist layer 36, which includes the openings 36X, is formed on the upper surfaces of the wiring layer 35 and the insulation layer 34. The solder resist layer 36 is formed by, for example, laminating the upper surfaces of the wiring layer 35 and the insulation layer 34 with a photosensitive resin film or applying a liquid or paste resin to the upper surfaces of the wiring layer 35 and the insulation layer 34. The resin is patterned into a certain shape by undergoing exposure and development in a photolithography process. The openings 36X expose portions in the upper surface of the wiring layer 35 as the external connection terminals P2.

Figure 5:
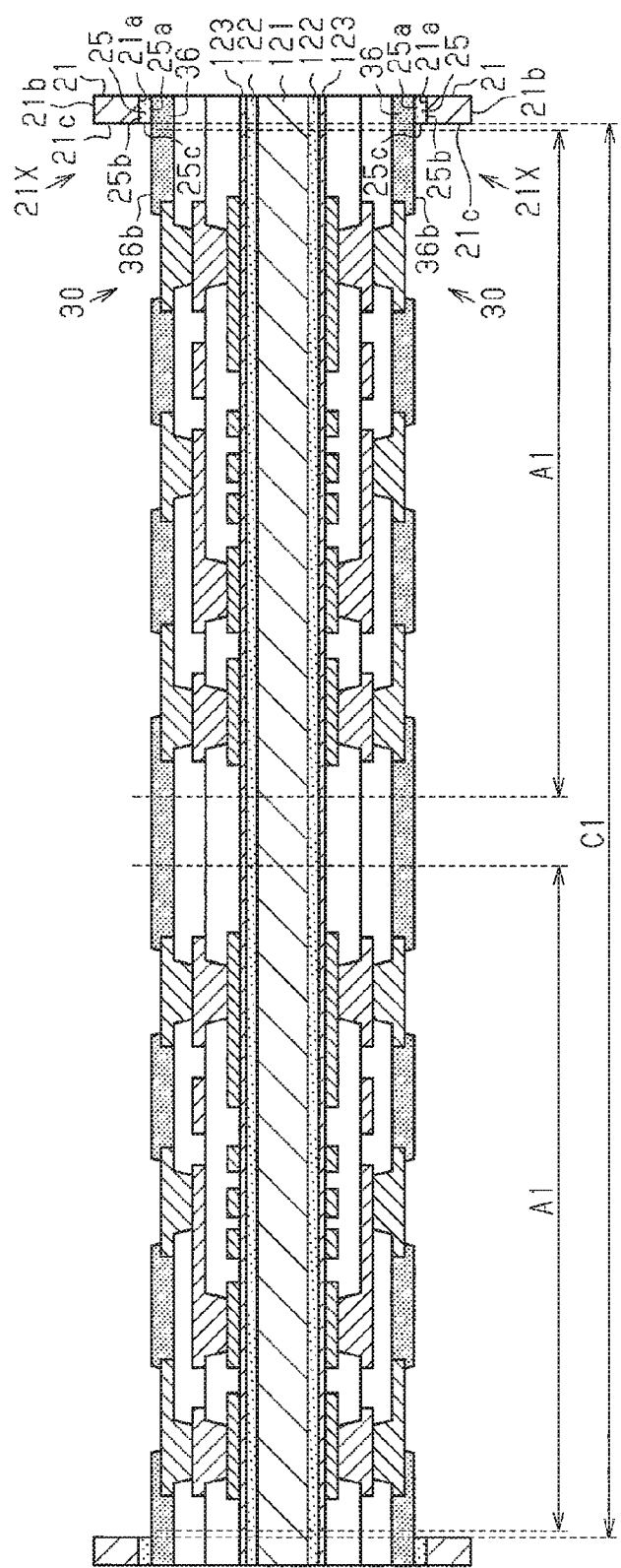

In the step of FIG. 5, the first carrier base material 21 is adhered by the adhesive layer 25 to the surface of the solder resist layer 36 (lower surface 36b in FIG. 1A). In the present example, the first carrier base material 21 is adhered by the adhesive layer 25 to the lower surface 36b of the solder resist layer 36 at the outer side of the product area C1 so that the product area C1 is located in the opening 21X of the first carrier base material 21, that is, so that the first carrier base material 21 surrounds the product area C1.

Figure 6:
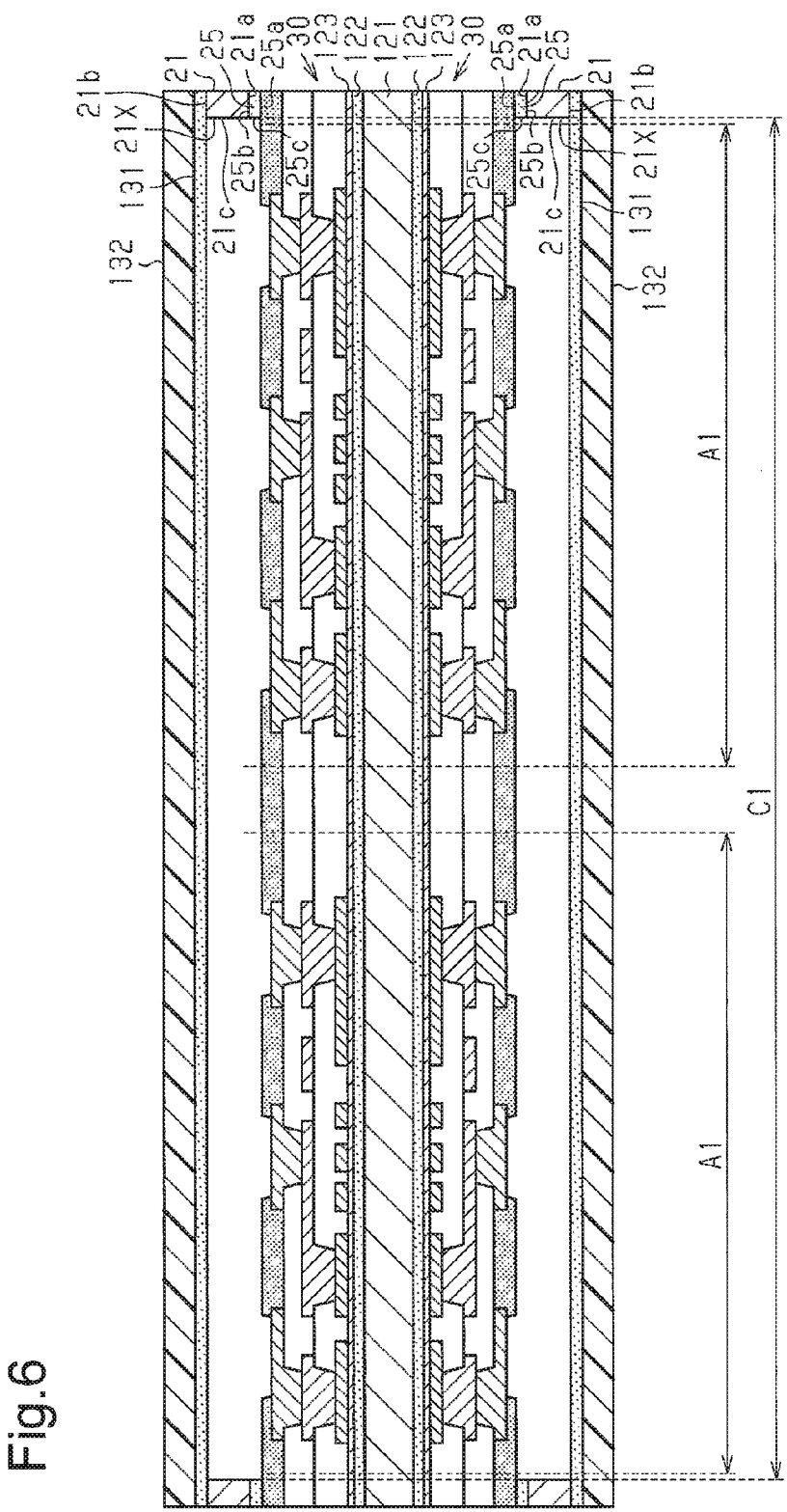

In the step of FIG. 6, a protection film 132 is adhered by an adhesive layer 131 to the surface of the first carrier base material 21 (lower surface 21b in FIG. 1A). The protection film 132 closes the opening 21X of the first carrier base material 21. The adhesive layer 131 may be formed by, for example, a material of which the adhesive force decreases when irradiated with ultraviolet rays. The protection film 132 may be formed from a material that is resistant to etching performed in a subsequent step. For example, the protection film 132 may be formed by a photosensitive dry film (e.g., novolak resin or acrylic resin).

Figure 7:
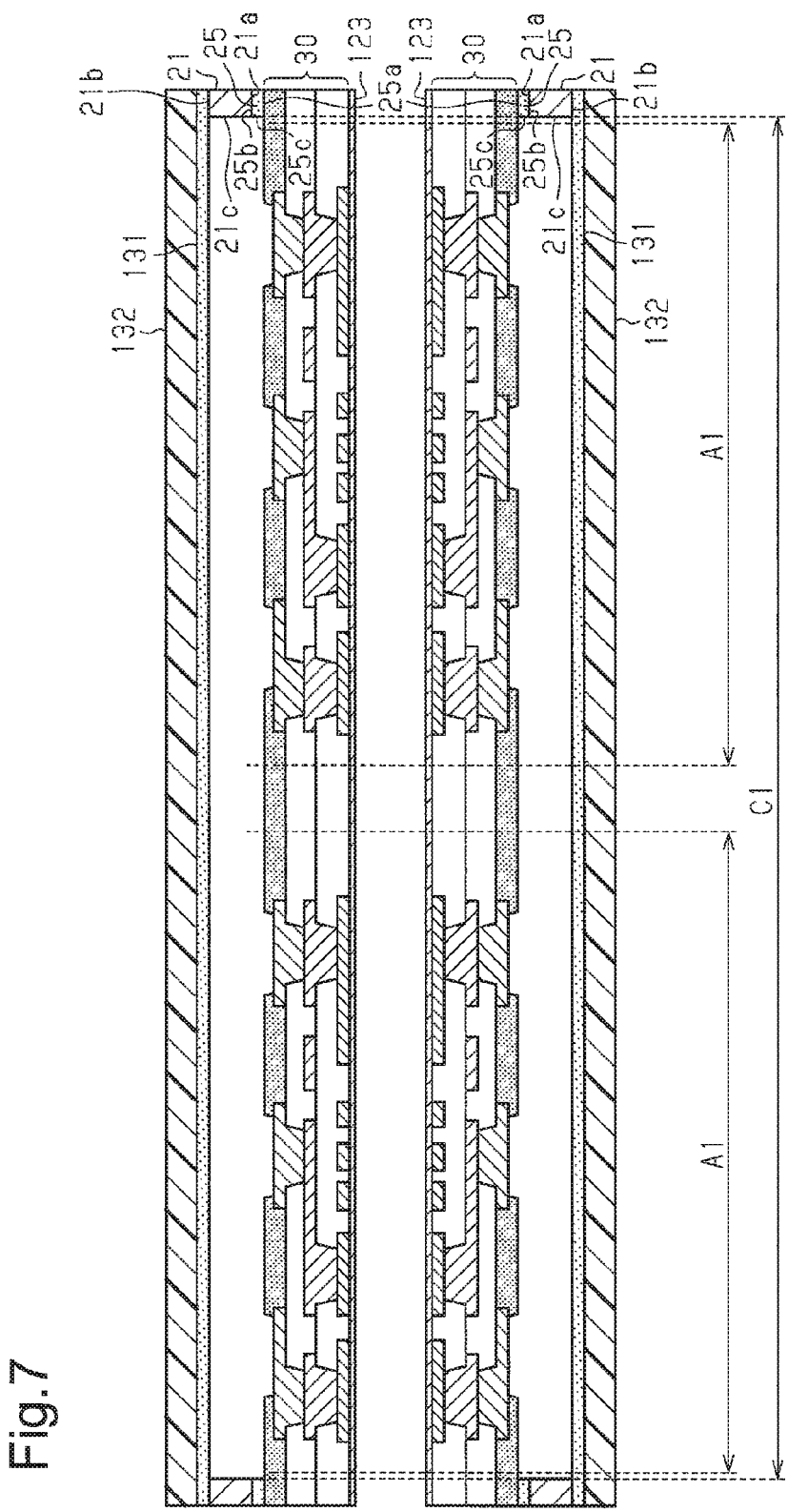

In the step of FIG. 7, the two wiring substrates 30 are separated from the support substrate 121 illustrated in FIG. 6. When removed from the support substrate 121, each wiring substrate 30 is supported by the first carrier base material 21.

In the step of FIG. 8A, the metal layer 123 (refer to FIG. 7) is removed through, for example, etching to expose the upper surfaces of the wiring layer 31 and the insulation layer 32.

In the step of FIG. 8B, sheet-cutting is performed to form the carrier base material-added wiring substrate 10. Then, the protection film 132 is removed to expose the external connection terminals P2. Further, an electrical inspection is conducted on the wiring substrates 30 included in the carrier base material-added wiring substrate 10. That is, an electrical test is conducted on the wiring structure of each product section A1 in the sheet-like carrier base material-added wiring substrate 10 (refer to FIG. 2C).

The electrical test is conducted on the sheet-like carrier base material-added wiring substrate 10 after cutting the work substrate 40 that is illustrated in FIG. 2A and forming the carrier base material-added wiring substrate 10 that is illustrated in FIG. 2B.

Referring to FIG. 8B, an electrical test is conducted on the sheet-like carrier base material-added wiring substrate 10. In the present example, probe terminals T1 contact the component connection terminals P1 in the upper surface of the wiring substrate 30, and probe terminals T2 contact the external connection terminals P2 in the lower surface of the wiring substrate 30. Various types of electrical tests (open test, short test, and the like) are conducted on the wiring substrate 30 with the probe terminals T1 and T2.

The wiring substrate 30 is supported by the carrier base material 21. This facilitates handling (carrying) of the wiring substrate 30 when performing an electrical test with a test device. The carrier base material 21 includes the openings 21X that expose the product areas C1 of the wiring substrate 30. Accordingly, the test probe terminals T2 can easily contact the external connection terminals P2 in the wiring substrate 30, which is adhered to the carrier base material 21, to conduct an electrical test.

The electrical test, which is conducted as described above, determines whether or not the wiring substrate 30 in each product section A1 is defective. The wiring substrate 30 is marked in accordance with the determination result. For example, a given marking is indicated on the wiring substrate 30 when determined as being defective.

In the step of FIG. 8C, the second carrier base material 22 is arranged in the opening 21X of the first carrier base material 21, and the third carrier base material 23 is adhered to the first carrier base material 21. In this manner, the wiring substrate 30 is supported by the carrier base material 20. In the present example, the upper surface 22a of the second carrier base material 22 directly contacts the lower surface 36b of the solder resist layer 36 in the product areas C1 of the wiring substrate 30. The upper surface 22a of the second carrier base material 22 is in contact with the lower surface 36b of the solder resist layer 36 but not adhered to the lower surface 36b. In other words, an adhesive layer is not arranged between the second carrier base material 22 and the wiring substrate 30 (i.e., solder resist layer 36). The lower surface 21b of the first carrier base material 21 is adhered to the upper surface 27a of the adhesive layer 27 on the peripheral portion of the third carrier base material 23.

The side surfaces 21c of the first carrier base material 21 and the side surfaces 25c of the adhesive layer 25 are spaced apart from and face to the side surfaces 22c of the second carrier base material 22 and the side surfaces 26c of the adhesive layer 26. The side surfaces 21c and 25c are spaced apart by the gap S from the side surfaces 22c and 26c.

The manufacturing steps of a semiconductor device using the carrier base material-added wiring substrate 10 will now be described.

Figure 9A:
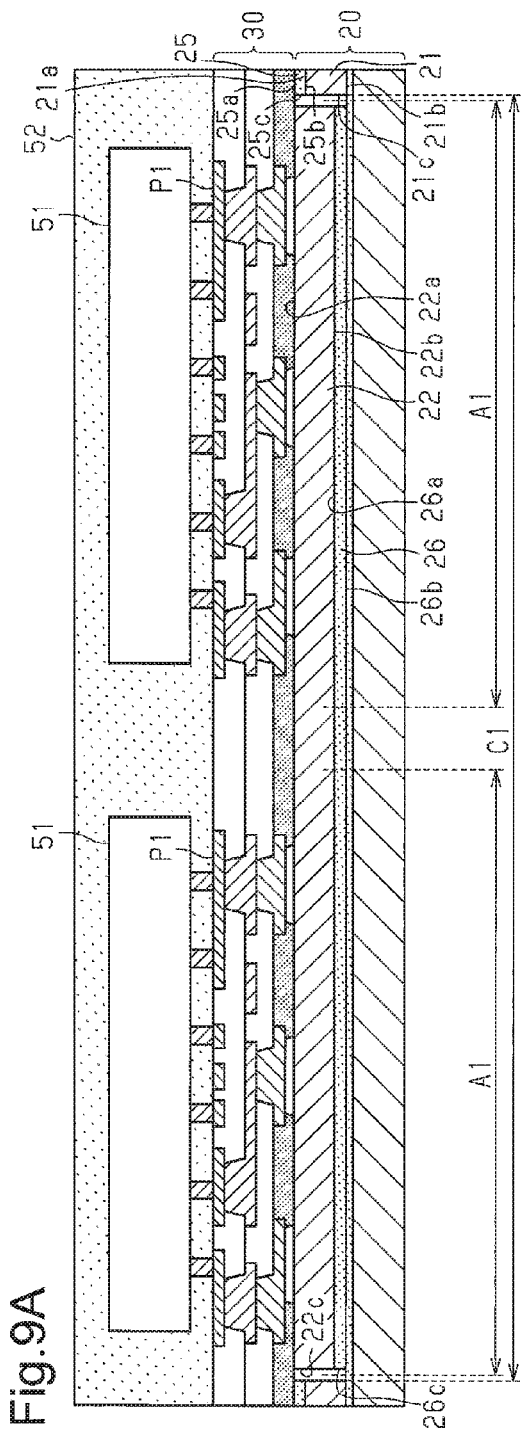

In the step of FIG. 9A, the semiconductor elements 51 are connected to the component connection terminals P1 in the upper surface of the carrier base material-added wiring substrate 10. Then, an encapsulation resin 52 is formed to encapsulate the semiconductor elements 51. Here, when a wiring substrate 30 has not been marked in the electrical test, that is, when a wiring substrate 30 has been determined as being non-defective, a semiconductor element 51 is mounted on the wiring substrate 30. When a wiring substrate 30 has been marked, that is, when a wiring substrate 30 has been determined as being defective, a semiconductor element 51 is not mounted on the wiring substrate 30. Thus, time is not used in an unnecessary manner to mount a semiconductor element 51 onto a defective wiring substrate. This also prevents the semiconductor element 51 from being wasted because of the semiconductor element 51 being mounted on a defective wiring substrate.

The encapsulation resin 52 covers the semiconductor elements 51 and the upper surface of the wiring substrate 30. The encapsulation resin 52 is formed from, for example, a thermosetting epoxy insulative resin. The insulative resin does not necessarily have to be thermosetting and may be photosensitive instead.

Figure 9B:
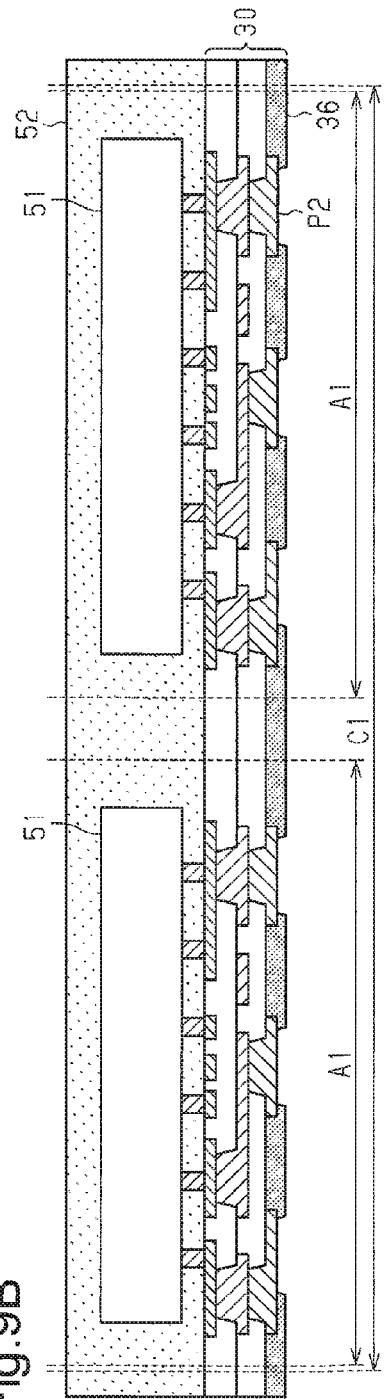

In the step of FIG. 9B, the carrier base material 20 is removed. For example, the adhesive layer 25, which adheres the first carrier base material 21 illustrated in FIG. 9A to the wiring substrate 30, is irradiated with ultraviolet rays to lower the adhesive force of the adhesive layer 25 and remove the carrier base material 20.

In the step of FIG. 10A, bumps 61 are formed on the external connection terminals P2 for mounting on another substrate. The bumps 61 are, for example, solder bumps. The bumps 61 may be formed by solder balls arranged on the external connection terminals P2 or by a solder paste that has undergone a reflow process after being applied to the external connection terminals P2.

In the step of FIG. 10B, the structure of FIG. 10A is singulated into semiconductor devices 70. The wiring substrate 30 and the encapsulation resin 52, which are illustrated in FIG. 10A, are cut around the product sections A1 with a dicing blade or the like to singulate the semiconductor devices 70.

The operation of the carrier base material-added wiring substrate 10 will now be described.

The wiring substrate 30 undergoes electrical tests in a state in which the first carrier base material 21 is adhered to the wiring substrate 30. The first carrier base material 21 includes the openings 21X that expose the product areas C1 of the wiring substrate 30. Thus, even when the first carrier base material 21 is adhered to the wiring substrate 30, an electrical test can be conducted on the wiring substrate 30.

As described above, the wiring substrate 30 is supported by the first carrier base material 21 when transported. The first carrier base material 21 limits warping or the like of the wiring substrate 30. Thus, the wiring substrate 30 that is supported by the first carrier base material 21 can be transported to a device that mounts semiconductor elements. However, it is difficult to mount semiconductor elements in this state.

FIGS. 12A and 12B illustrate an assembling step in which the semiconductor element 51 is mounted on the wiring substrate 30 that is supported only by the first carrier base material 21. FIGS. 12A and 12B illustrate a first carrier base material 21 including an opening 21X that exposes a product area C1 including a single product section A1. The semiconductor element 51 is supported by a mounting device and mounted on the wiring substrate 30. Here, the product area C1 of the wiring substrate 30 is exposed from the opening 21X of the first carrier base material 21. Thus, the pressure applied when the semiconductor element 51 is mounted deforms the wiring substrate 30. When the wiring substrate 30 deforms, it may be difficult for terminals 51a near the central portion of the semiconductor element 51 to contact the component connection terminals P1 of the wiring substrate 30. This may result in defective connections. Further, deformation of the wiring substrate 30 may produce cracks in the wiring substrate 30 or cause breakage in the wiring layers.

In view of this, with the carrier base material-added wiring substrate 10 of the present embodiment, the wiring substrate 30 is supported by the second carrier base material 22, which is located in the opening 21X of the first carrier base material 21, and the third carrier base material 23, which holds the first and second carrier base materials 21 and 22. Accordingly, even if the mounting of the semiconductor element 51 on the wiring substrate 30 applies pressure to the wiring substrate 30, the wiring substrate 30 resists warping. That is, the second and third carrier base materials 22 and 23 limit warping of the wiring substrate 30. Thus, the terminals 51a of the semiconductor element 51 are properly connected to the component connection terminals P1 of the wiring substrate 30, and defective connections are reduced. Further, the limited warping of the wiring substrate 30 reduces cracking and wiring breakage in the wiring substrate 30.

[1] The present embodiment has the advantages described below.

(1) The carrier base material-added wiring substrate 10 includes the carrier base material 20 and the wiring substrate 30. The wiring substrate 30 has the structure of a coreless wiring substrate in which the wiring layer 31, the insulation layer 32, the wiring layer 33, the insulation layer 34, and the wiring layer 35 are stacked one upon another. The solder resist layer 36 is formed on the lower surface of the insulation layer 34 to cover portions of the wiring layer 35. The solder resist layer 36 includes the openings 36X that exposes portions of the wiring layer 35 as the external connection terminals P2.

The carrier base material 20 includes the first carrier base material 21 that is adhered to the wiring substrate 30, the second carrier base material 22 that is arranged in the opening 21X of the first carrier base material 21, and the third carrier base material 23 that is adhered to the first and second carrier base materials 21 and 22. The carrier base material 20 allows for easy handling of the wiring substrate 30 that has a coreless structure.

(2) The first carrier base material 21 includes the openings 21X that expose the product areas C1 of the wiring substrate 30. When the wiring substrate 30 undergoes an electrical test step, the test probe terminals T2 are inserted from the openings 21X of the first carrier base material 21 to contact the external connection terminals P2 of the wiring substrate 30. In this manner, each of the openings 21X of the first carrier base material 21 exposes the external connection terminals P2 of the wiring substrate 30 and allows electrical tests to be conducted on the wiring substrate 30 in a state in which the wiring substrate 30 is supported by the first carrier base material 21.

(3) After electrical tests are conducted, the second carrier base material 22 is arranged in the opening 21X of the first carrier base material 21, and the third carrier base material 23 is adhered to the first carrier base material 21. Accordingly, when the semiconductor element 51 is mounted on the wiring substrate 30, the wiring substrate 30 is supported by the second carrier base material 22, which is arranged in the opening 21X of the first carrier base material 21, and the third carrier base material 23, which is held by the first and second carrier base materials 21 and 22. Accordingly, even when the mounting of the semiconductor element 51 on the wiring substrate 30 applies pressure to the wiring substrate 30, warping of the wiring substrate 30 is limited. Thus, the terminals 51a of the semiconductor element 51 may be properly connected to the component connection terminals P1 of the wiring substrate 30, and defective connections are reduced. Further, the limited warping of the wiring substrate 30 reduces cracking and wiring breakage in the wiring substrate 30.

(4) The upper surface 22a of the second carrier base material 22 directly contacts the wiring substrate 30 without an adhesive layer arranged in between. Thus, when removing the carrier base material 20, there is no residue of an adhesive layer on the external connection terminals P2 and the solder resist layer 36 of the wiring substrate 30.

(5) The first carrier base material 21 is adhered by the adhesive layer 25 to the lower surface of the wiring substrate 30, that is, the lower surface 36b of the solder resist layer 36. The third carrier base material 23 is adhered by the adhesive layer 27 to the first carrier base material 21. The adhesive force of the adhesive layer 27 is stronger than the adhesive force of the adhesive layer 25. Thus, when removing the carrier base material 20, the first and third carrier base materials 21 and 23 are removed together because the adhesive layer 27, which has a stronger adhesive force, keeps the first carrier base material 21 adhered to the third carrier base material 23. In this manner, the first carrier base material 21 is easily removed together with the third carrier base material 23.

(6) The probe terminals T2, which are used to conduct electrical tests on the wiring substrate 30, contact the external connection terminals P2 of the wiring substrate 30 through the openings 21X of the first carrier base material 21, which is adhered to the wiring substrate 30. When a carrier base material does not include the openings 21X, in order to conduct an electrical test on the wiring substrate 30, the carrier base material would have to be removed from the wiring substrate 30 and then re-adhered to the wiring substrate 30. In the carrier base material-added wiring substrate 10 of the present embodiment, the first carrier base material 21 includes the openings 21X. Thus, there is no need to remove and re-adhered the carrier base material. This decreases the number of manufacturing steps and reduces the manufacturing time.

It should be apparent to those skilled in the art that the foregoing embodiments may be employed in many other specific forms without departing from the scope of this disclosure. Particularly, it should be understood that the foregoing embodiments may be employed in the following forms.

In the above embodiment, the openings 21X of the first carrier base material 21 may be formed for each product section A1 as illustrated in FIG. 13.

In the above embodiment, the number of the product areas C1 (refer to FIG. 2C) that are included in the carrier base material-added wiring substrate 10 and the number of the product sections A1 that are included in each product area C1 may be changed. Further, the number of the product areas C1 that are included in the work substrate 40 (refer to FIG. 2A), that is, the number of the carrier base material-added wiring substrates 10 formed from the work substrate 40, may be changed.

In the above embodiment, the number of insulation layers and wiring layers in the wiring substrate 30 may be changed.

Clauses

This disclosure further encompasses embodiments described below.

1. A method for manufacturing a carrier base material-added wiring substrate, the method including:
preparing a first carrier base material that is frame-shaped and includes an opening corresponding to a product area of a wiring substrate;
stacking wiring layers and insulation layers on a support body to form the wiring substrate;
adhering the first carrier base material to the wiring substrate;
removing the support body;
conducting an electrical test on the wiring substrate with a probe terminal inserted into the opening of the first carrier base material; and
adhering a third carrier base material, which covers the opening of the first carrier base material, to the first carrier base material while arranging a second carrier base material in the opening of the first carrier base material.

2. The method according to clause 1, wherein the preparing a first carrier base material includes
cutting a single substrate to form the first carrier base material that includes the opening, and
obtaining a member cut out from the single substrate in correspondence with the opening as the second carrier base material.

3. The method according to clause 1, wherein:
the preparing a first carrier base material includes
preparing a single substrate including a first adhesive layer, the first adhesive layer being formed on one surface of the single substrate,
cutting the single substrate and the first adhesive layer to obtain the first carrier base material that includes the opening, and
obtaining a member cut out from the single substrate in correspondence with the opening as the second carrier base material, wherein the cutting divides the first adhesive layer into a second adhesive layer on the first carrier base material and a third adhesive layer on the second carrier base material;
the adhering the first carrier base material to the wiring substrate includes adhering the first carrier base material to the wiring substrate with the second adhesive layer; and
the method further including:
preparing a third carrier base material including a fourth adhesive layer, the fourth adhesive layer being formed on one surface of the third carrier base material;

adhering the second carrier base material to the third carrier base material with the third adhesive layer and the fourth adhesive layer; and adhering the third carrier base material to the first carrier base material with the fourth adhesive layer.

4. The method according to clause 3, wherein the second adhesive layer has an adhesive force that is weaker than that of the fourth adhesive layer.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A carrier base material-added wiring substrate comprising:
   a wiring substrate;
   a first carrier base material adhered by a first adhesive layer to a lower surface of the wiring substrate, wherein the first carrier base material includes an opening that exposes a product area of the wiring substrate;
   a second carrier base material arranged in the opening of the first carrier base material, wherein the second carrier base material contacts the lower surface of the wiring substrate; and
   a third carrier base material adhered by a second adhesive layer to the first carrier base material and the second carrier base material, wherein the third carrier base material covers the opening of the first carrier base material and wherein the second adhesive layer is formed entirely on an upper surface of the third carrier base material.

2. The carrier base material-added wiring substrate according to claim 1, wherein:
   the second carrier base material includes an upper surface and a lower surface located at an opposite side of the upper surface;
   the upper surface of the second carrier base material is in contact with the lower surface of the wiring substrate;
   a third adhesive layer is formed on the lower surface of the second carrier base material; and
   the third adhesive layer is adhered to the second adhesive layer.

3. The carrier base material-added wiring substrate according to claim 2, wherein
   the second carrier base material has a thickness that is the same as that of the first carrier base material, and
   the third adhesive layer has a thickness that is the same as that of the first adhesive layer.

4. The carrier base material-added wiring substrate according to claim 2, wherein the first adhesive layer has an adhesive force that is weaker than that of the second adhesive layer.

5. The carrier base material-added wiring substrate according to claim 1, wherein:
   the wiring substrate includes a plurality of wiring layers, a plurality of insulation layers, and a solder resist layer, wherein the solder resist layer is stacked on a lower surface of a lowermost one of the insulation layers and partially exposes a lowermost one of the wiring layers as an external connection terminal;
   the first carrier base material is adhered by the first adhesive layer to a lower surface of the solder resist layer; and
   the upper surface of the second carrier base material directly contacts the lower surface of the solder resist layer in the opening of the first carrier base material.

6. The carrier base material-added wiring substrate according to claim 2, wherein:
   the first carrier base material and the first adhesive layer are identical in shape in a plan view; and
   the second carrier base material and the third adhesive layer are identical in shape in a plan view.

7. The carrier base material-added wiring substrate according to claim 6, wherein:
   wherein side surfaces of the first carrier base material and side surfaces of the first adhesive layer are spaced apart from and face to side surfaces of the second carrier base material and side surfaces of the third adhesive layer.

* * * * *